United States Patent [19]
Engel

[11] 3,976,863
[45] Aug. 24, 1976

[54] OPTIMAL DECODER FOR NON-STATIONARY SIGNALS

[75] Inventor: Alfred Engel, Trenton, N.J.

[73] Assignee: Alfred Engel, Trenton, N.J.

[22] Filed: July 1, 1974

[21] Appl. No.: 484,420

[52] U.S. Cl. .............................. 235/152; 324/77 E
[51] Int. Cl.² .................... G01R 23/00; G06F 15/34
[58] Field of Search........... 235/152, 156; 324/77 R, 324/77 E; 328/150, 167; 444/1; 343/55 A

[56] References Cited
UNITED STATES PATENTS

| | | | |
|---|---|---|---|
| 3,587,097 | 6/1971 | Stull, Jr. ............................. | 324/77 E |
| 3,611,165 | 10/1971 | Hills..................................... | 328/167 |
| 3,714,566 | 1/1973 | Kang................................. | 235/156 X |
| 3,714,566 | 1/1973 | Kang................................. | 235/156 X |
| 3,731,188 | 5/1973 | Smith................................. | 324/77 E |

OTHER PUBLICATIONS

R. Bakist & H. F. Silverman "Fast Digital Filterbanks for Speech Processing," *IBM Tech. Disclosure Bulletin*, vol. 16, No. 2, July 1973, pp. 573–574.

Primary Examiner—David H. Malzahn
Attorney, Agent, or Firm—Ostrolenk, Faber, Gerb & Soffen

[57] ABSTRACT

The decoder is a real time electronic device for processing, decoding and classifying data whose optimally achievable format of encoding is not known a prioristically but is desired to become known for either future optimal encoding, transmission, decoding for classificational discrimination or for storage. The decoder operates on rawdata inputs.

The decoder may be manifested in either of two forms, namely a complete decoder for use as a laboratory research tool or an incomplete decoder which consists of all and only that subset of a complete decoder which is relevant for decoding a particular class of inputs whose application limits are well defined in the information theoretic sense. In general, the input to be processed is a non-stationary signal in analog form. The output of the decoder is usually sampled at most twice the cut-off frequency of the highest frequency component contained within the signal being analyzed. In the complete decoder form, the $2^N-1$ outputs serve as a means for recognizing all components within the frequency spectrum of the unknown analog signal being decoded. The derived outputs may be scaled and quantized or be left in their normal output form. In either form the outputs represent all possible classes of characteristics which could be of value for optimal coding. In particular, the totality of outputs represents diverse information theoretic and physical qualities and dimensions.

32 Claims, 17 Drawing Figures

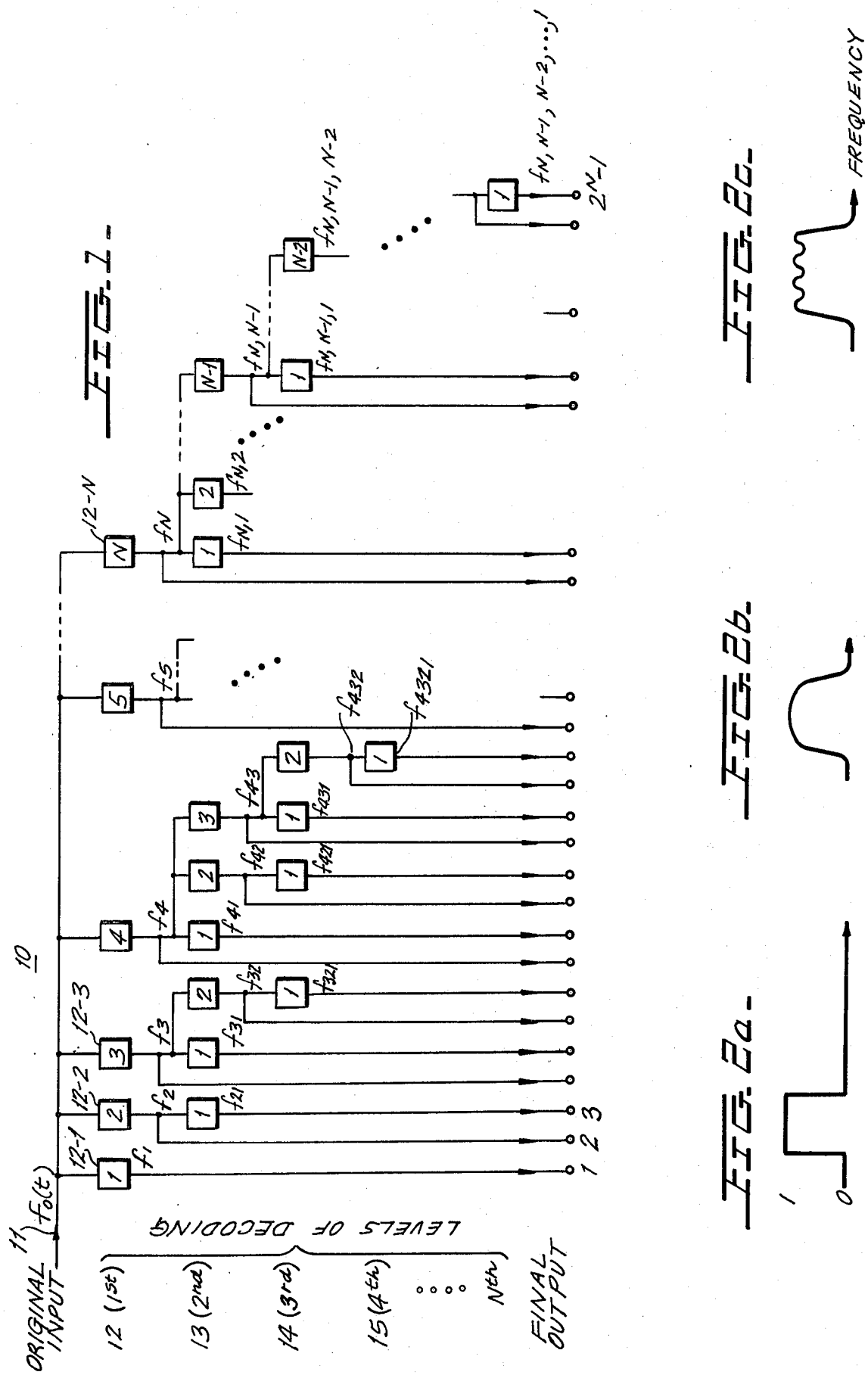

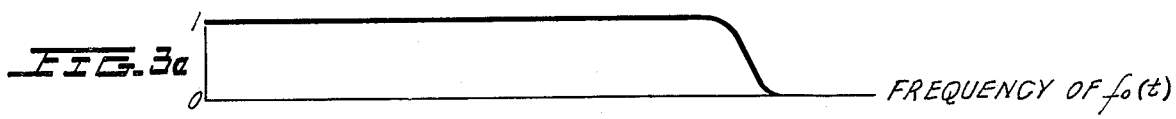
FIG. 3a. — FREQUENCY OF $f_0(t)$
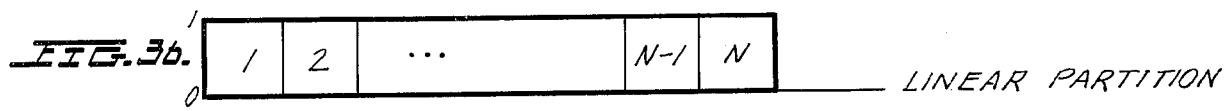
FIG. 3b. — LINEAR PARTITION
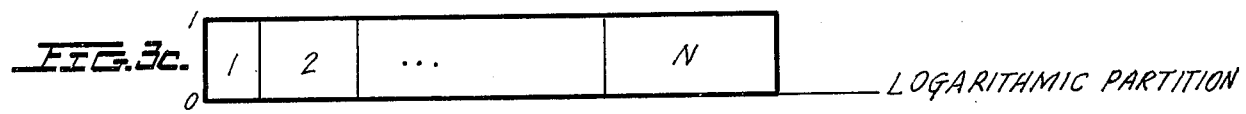
FIG. 3c. — LOGARITHMIC PARTITION
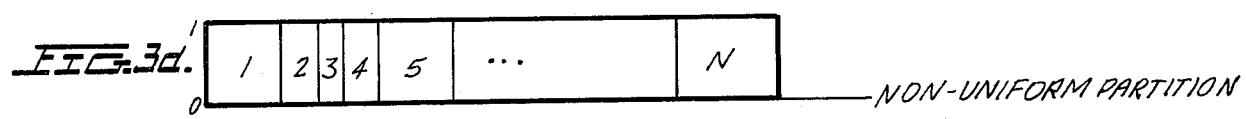
FIG. 3d. — NON-UNIFORM PARTITION
FIG. 3e. — INTERMITTENT PARTITION
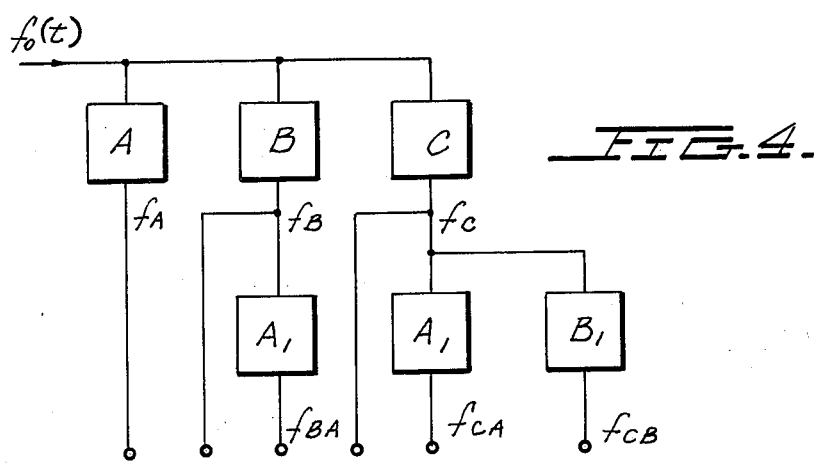
FIG. 4.
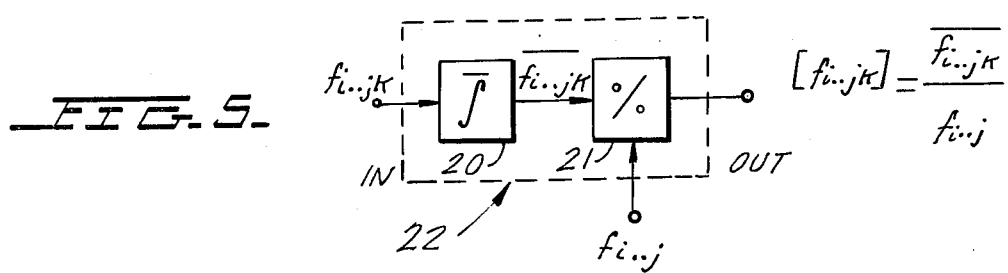
FIG. 5.
$$[f_{i\ldots jk}] = \frac{\overline{f_{i\ldots jk}}}{f_{i\ldots j}}$$

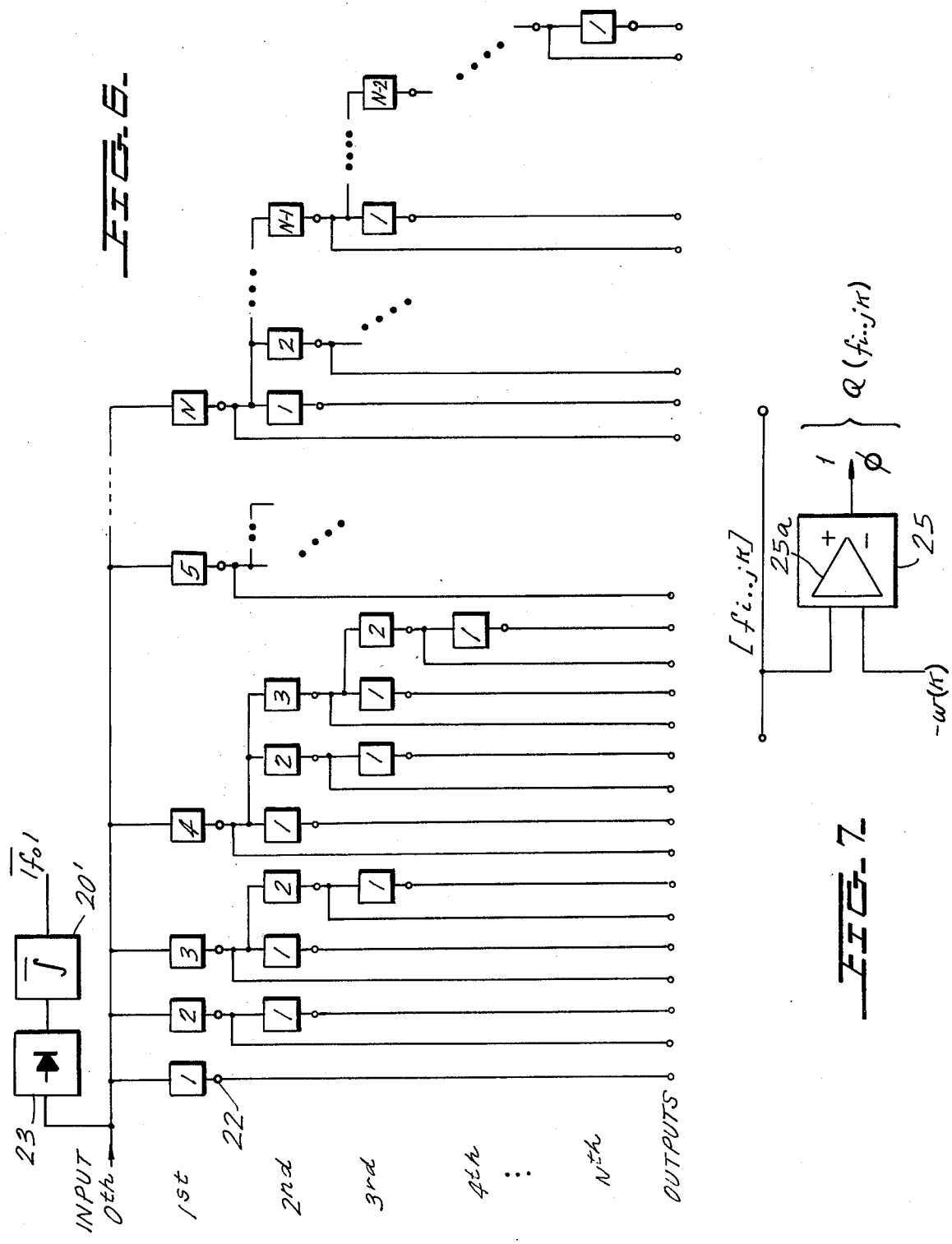

OPTIMAL DECODER FOR NON-STATIONARY SIGNALS

The present invention relates to decoders and more particularly to non-stationary decoders for providing complete analysis and identification of unknown signals of either non-stationary or stationary type.

BACKGROUND OF THE INVENTION

The present invention relates to the general and optimal decoding and characterization of any non-stationary signal that is given say, as a function of time. The method is general in nature because it applies to all non-stationary as well as stationary signals irrespective of origin. By virtue of the algebraic structure underlying the circuit connections, the method is also optimal in the informaion theoretic sense of Shannon. One of the major reasons of its optimality, even on non-stationary signals, is readily seen by contrasting the invention to known methods of signal characterization.

Practically all known methods for characterization of time dependent functions, for example the methods of Fourier transformation, Laguerre filtering, Wiener canonical expansion, Hadamard matrices, Walsh transforms, and so forth, are limited to stationary signals because they use tine windows as basic inputs and assume or impose stationarity within them, or transform immediately into a non-time domain or, finally, they enforce time partitions such that any continuous monitoring of non-stationary phenomena is both disrupted and lost for purposes of further decoding. The mathematical equivalence between orthogonalization and stationarity has been pointed out with emphasis by A. Sommerfeld in his "Lectures on Theoretical Physics, Volume VI: Partial Differential Equations in Physics" New York 1949 (Academic Press Inc.) The limitations of digital computers which are both sequential rather than parallel devices and sampling rather than continuous devices are also well known.

No present day devices exist for processing non-stationary signals which do not make stationarity assumptions in their attempts toward decoding, nor can present day devices approach the theoretical limit in bandwidth compression for purposes of encoding. The processing of stationary signals has been accomplished by the present day technology in the form of fast Fourier, fast Hadamard, or fast Walsh transform processors, etc. However, analysis shows that much potential information is lost when a non-stationary signal is processed through such devices which make stationarity assumptions. Even a delay line tapped at appropriate points to facilitate a fast Fourier transform (FFT) whose multitude of time windows is adaptive to the duration of individual periods of harmonics is limited to less than complete decoding by the fact that the FFT outputs all have the same physical dimension and, thus, do not exhaust all informaion theoretic classes into which non-stationary information can be encoded.

Since most signals in the real world are non-stationary, their individuality and recognizability are manifested in their non-stationary features. Some specific examples of non-stationary signals are acoustic signals generated from starting an engine or dropping an object to the floor wth the stated objective of identifying the type of engine or object. On the other hand, the sustained sound of a smoothly running engine is an example of an approximately stationary signal. All present day procesors make the initial assumption that signals being processed are stationary over several periods of harmonics and/or trust that the extractable stationary features of the same physical quality are adequate to characterize and recognize non-stationary signals. Generally, this is not the case.

BRIEF DESCRIPTION OF THE INVENTION

The present invention is characterized by providing method and apparatus for analyzing both non-stationary and stationary signals. In the present invention, also, no basic window is required. The input itself is not sampled but is instantaneous, no time partitions but rather sequences of frequency partitions are made in a well defined algebraic structure, and all intermediate and final outputs are diverse functions of the independent variable (for example, time) of the original input function. Finally, the outputs of the device developed by hardware incorporating the principles of the present invention can be taken in their natural form of continuous variables or alternatively can be binarized, either in a signal adaptive or problem-analysis-adaptive manner. In the form of continuous (discrete) outputs, one can apply Shannon's theory of continuous (discrete) channels in order to prove optimal decoding in the device.

Before a consideration of the hardware manifestations of the present invention, consideration of a few major objectives of the decoding of non-stationary signals will be given.

Phenomenologically, and in agreement with its mathematical definition, a non-stationary signal reveals new information during subsequent time samples. Therefore, the output of an efficient non-stationarity decoder must allow for time samples and, thus, its independent output variable must agree with the independent input variable, e.g. time.

Another aspect is that non-stationarity is mostly generated by non-uniform changes in the constituent frequencies of the original input signal. Consequently, non-stationarity must be decoded by detecting when and which constituent component is changed and in what manner the change is effected. This objective, in turn, requires two tasks to be accomplished: first, the detection of constituents requires partitions in the frequency domain, not in the time domain; and second, the determination in what manner the change is affected requires iterative decoding which is methodologically equivalent to frequency partitions of frequency partitions. One could liken this second process to a frequency-differentiation.

The third objective of determining when changes occur is met automatically because time dependent outputs can be time sampled, for example, by throwing switches, if one thinks of binarized outputs. In this manner, one is ultimately provided with a time sequence of code words whose sequential Hamming distances and invariances reflect directly the non-stationary and stationary features, respectively, of the original input. By virtue of the sequential frequency partitioning, all conceivable modes of generating non-stationarity are isolated in an optimal manner, similar to the well defined nature of the terms in a Taylor expansion.

It should be noted, if complete decoding in the information theoretic sense can be proven for any non-stationary signal - and we assert this for the present invention-then one has also shown that all perceptual indicators and identifiers of non-stationary signals as experienced, for example, by the human ear are adequately and unambiguously represented in the output code words of said non-stationarity decoder. Under such conditions, the importance and general applicability of the present invention becomes obvious.

The present invention in one major embodiment is comprised of an algebraically complete decoder having N complete decoding levels. Decoding is obtained through the use of decoding networks which on all levels employ preferably non-overlapping filters covering the entire frequency spectrum of the analog signal being analyzed at these points. The frequency ranges of the N filters of these levels may be partitioned linearly, logarithmically, non-uniformly or intermittently, depending upon the particular application at hand. Each one of the outputs of the N filters of the first level either does or does not contain modulation of amplitude, phase or frequency or combinations thereof. The task is then to confirm the absence or presence of side bands which may be within or without the specific filter range from which the output is taken. The next decoder level is then comprised of an array of filters equal in number to one less than the index of the filter to whose output it is coupled wherein the filters of the first level are designated 1, 2, 3, . . ., N. The filters of the second level thereby function to identify and recognize the presence of side bands. A third level array of filters is then similarly and selectively coupled to each of the outputs of the second level filter array and so forth until a total of N decoding levels are provided with the entire system containing a total of $2^N-1$ filters for theoretically providing complete identification of all components within the frequency spectrum of the signal undergoing decoding.

The final outputs of the decoder originate at various levels and are assembled at the N-th level. If a non-zero input is presented to the decoder, some final outputs may stay at zero but others must show non-zero (and with proper scaling constant) output within certain sampling intervals. For distinct stationary or non-stationary phenomena of a given duration, certain outputs prove characteristic of a heuristic population by commonality of absence, presence and sequential change of their output signals. Since the final outputs originate at various levels, it is possible in defined applications that only part of all levels or part of all branches or parts of both are needed to fully decode and characterize a signal input. The process of establishing the commonality of a phenomenon from repeated occurrences amounts to the elimination of what is pragmatically considered noise. One, therefore, defines the necessary and sufficient subset of a complete decoder, i.e., an incomplete decoder which is relatively complete for the specific application. The decoding and encoding of the signal population as derived is optimum and minimal by virtue of the algebraic structure of the complete decoder and its subsets.

BRIEF DESCRIPTION OF THE FIGURES AND OBJECTS

It is therefore one object of the present invention to provide a novel non-stationarity decoder for use in completely characterizing and decoding both stationary and non-stationary signals.

Still another object of the present invention is to provide both complete and relatively complete decoders for analyzing non-stationary signals of the analog type which may respectively be employed for general purpose and special applications to provide complete analysis of both non-stationary and stationary signal populations.

The above as well as other objects of the present invention will become apparent when reading the accompanying description and drawings in which:

FIG. 1 shows a block diagram of a complete non-stationarity decoder for analyzing both stationary and non-stationary signals of the continuous type.

FIGS. 2a through 2c show curves depicting typical filter characteristics of analyzing networks.

FIGS. 3a through 3e are simplified diagrams depicting some possible types of frequency partitions over an input signal frequency range and which may be employed in the decoder of the present invention.

FIG. 4 shows a simplified block diagram of a minimum size decoder.

FIG. 5 shows a simplified block diagram of a scaling network which may be employed in the decoders of the present invention.

FIG. 6 shows a simplified block diagram of a non-stationarity decoder embodying the principles of the present invention and which incorporates scaling means.

FIG. 7 shows a simplified block diagram of a binary quantizer which may be utilized in addition to and after the scaled decoder function.

DETAILED DESCRIPTION OF THE INVENTION

Figure 8:
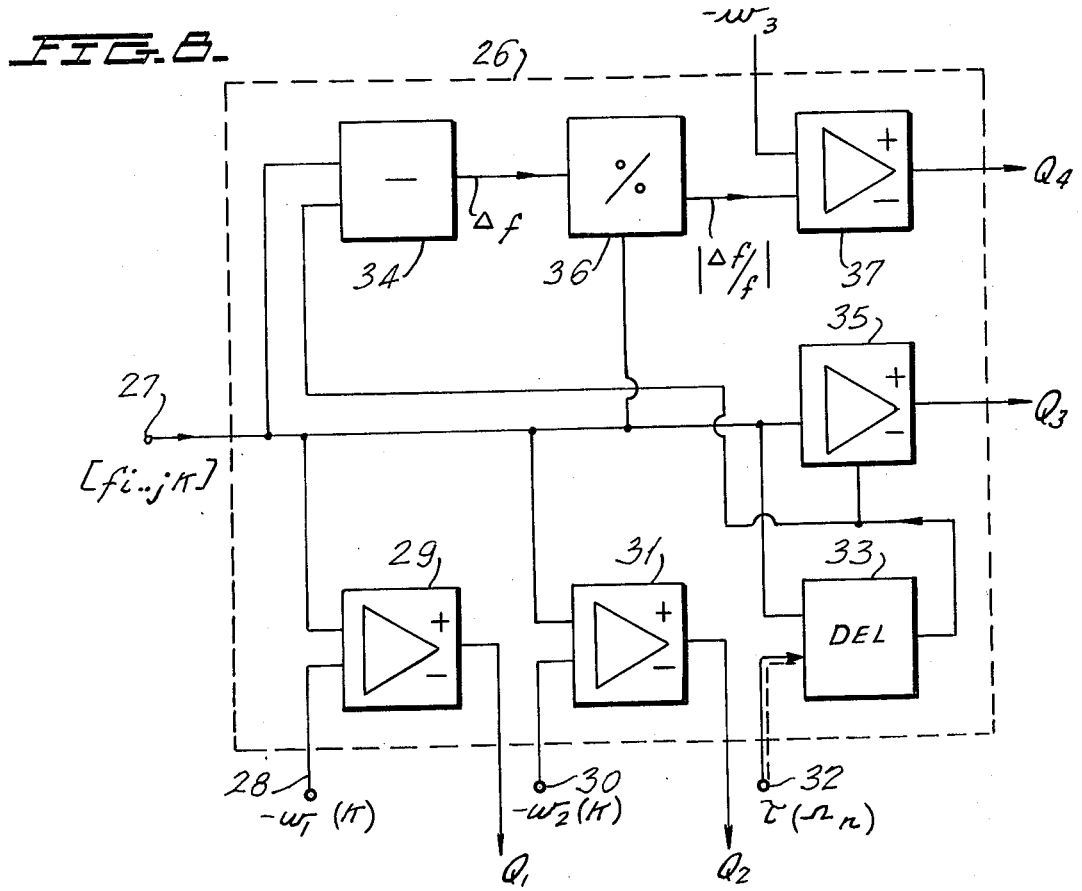
FIG. 8 shows a simplified block diagram of a 7-ary quantizer as an alternative and more elaborate form of quantization.

Initially an explanation of the general operation of a non-stationarity decoder will be given. FIG. 1 shows a simplified block diagram 10 for an algebraically complete non-stationarity decoder having N decoding levels. An N-level decoder as understood in this invention has, when algebraically complete, a single input terminal 11 and $2^N-1$ final outputs. With less than $2^N-1$ final outputs distributed over N levels, the decoder is algebraically incomplete but may still be relatively complete for a defined application.

Decoding is accomplished by decoding networks which are symbolized in FIG. 1 by rectangular blocks. The numbers following each designating numeral for each decoder level, such as for example the numbers 1, 2, 3, 4, . . ., N following the number 12, denote indices of the frequency ranges of particular decoding filters in an N-level decoder. An N-level decoder has N different analyzing filter ranges, most of which are employed in multiplicity such that an algebraically complete decoder of N-levels has a total of $2^N-1$ filters. Among these there are $2^{N-1}$ filters which belong to frequency range 1 and are designated as "outputs". At each level of decoding, one or more partitions of the signal "frequency" range of dimension $1/t$ are enforced. The outputs are always functions of the independent variable $t$, of some function $f_x(t)$ and ultimately of the original input $f_o(t)$, where $t$, for example, may be time.

The decoding networks in first array 12, i.e., filters 12-1, 12-2, 12-3, . . . ., 12-N cover the entire range of frequencies constituent to the original input $f_o(t)$. In abstract theory, these filters are of ideal rectangular passbands as depicted in FIG. 2a; in practice the filters will be, for example, of the Butterworth or Tchebyscheff type as are respectively shown in FIGS. 2b and 2c; they can also be realized by tapping a delay line.

Depending upon the application, the passband 1 to N, as in the first level 12 of FIG. 1, is partitioned in either a linear or logarithmic manner, or with non-uniform resolution for specific frequency ranges. FIGS. 3b through 3e show examples of typical partitions for an input signal $f_o(t)$ whose frequency spectrum is shown in FIG. 3a. In practice, of course, different filters are dimensioned for minimal overlaps and the steepest possible flanks. It is also obvious that overlapping filters would cause multiple representation of the same constituents in different branches of the decoder. One can look at this as crosstalk, redundant, and non-orthogonal representation; it is, therefore, undesirable and should be minimized. The filter tree of an algebraically complete decoder is constructed such that every output of a filter of index $n \leq N$ is followed by a set of filters of indices 1, 2, . . ., $n$-1 which gives rise to the binomial tree of FIG. 1.

When the function $f_o(t)$ to be decoded is inputted into the N different filters of the first level 12, one obtains N output functions, again in $t$, namely $f_1(t)$, . . . ., $f_N(t)$ where the index of each output denotes the filter of origin and these and higher order filter outputs are understood as representative of energy. While these outputs are not uni-frequent, they are of limited bandwidths. The outputs either do or do not contain modulation of amplitude, phase or frequency or combinations thereof. In any case, the task is to confirm absence or presence of sidebands. However, the sidebands may be within or without the specific filter range from which the output is taken.

If the sidebands are within the filter range $n$, the superposition of carrier and sidebands makes $f_n(t)$ a modulated nonconstant waveform which merits further filtering on the next decoder level where it is sufficient to recover the single sideband. For this reason the decoder filters the output $f_n(t)$ only through lower numbered filters 1, 2, . . . , $n$-1 but not through filters of index $n$ or higher.

If the non-constant waveform was modulated only by frequencies of one filter range, only one filter in the next decoder level will indicate a substantial output. If modulation originates from more than one filter range, several filters on the next decoder level will show substantial output. Furthermore, it is seen if one processes stationary (i.e., textbook type) modulation, that the modulating frequencies and carriers themselves do not change in time nor in amplitude. Consequently, in this case the secondary decoding levels $f_{21}, f_{31}, f_{32}, f_{41}, f_{42}$, . . . ., $f_{N,N-1}$ cannot show any values other than constants. This leaves $f_1(t)$ as the only output which will show oscillatory behavior under the conditions specified above.

Considering the alternative case wherein there are stationary modulaton sidebands outside of the filter range which contains the carrier, we realize that a stationary modulation produces constant outputs for both the filter embracing the carrier and the filters embracing the sidebands. In this case, even the first level outputs $f_1, f_2, f_3, . . . . , f_N$ are constant. From this it is understood that whatever type of modulation and difference frequency between carrier and modulating frequency exists, no stationary modulation can produce non-constant outputs beyond the first decoding level $f_1$, $f_2, f_3, . . . , f_N$ with the exception of a strictly periodic $f_1(t)$ in the special case mentioned above.

We find, therefore, than non-constant outputs from the second or higher decoder level are likely to be genuine indicators of non-stationary signal components in $f_o(t)$.

From the foregoing it is easily seen that whenever a non-stationary change occurs in frequency or amplitude of any band (i.e., sideband or carrier) a third or higher level decoder output must exhibit a change in amplitude and/or $f_1$ or a second level decoder output must exhibit a non-periodic change in amplitude. One objective of the present invention is to use this observation to distinguish stationary from non-stationary signals and then, by means of output monitoring, also to characterize both stationary and non-stationary portions of signals.

For this purpose we look for a moment at the decoder of FIG. 1 as a research tool in speech analysis. All original inputs when phonemically stationary, decode at the Nth level of final output into at most a periodic $f_1$, constant $f_{21}$, $f_{31}$ and all other N-th level outputs at zero. In order to characterize a phonemically stationary signal (i.e., phoneme without transient) with an N-level decoder, it is, therefore, in theory sufficient to record, from $2^N-1$ possible outputs, only the N first decoder level outputs (level 12) $f_1$ to $f_N$ and the $N(N-1)/2$ second decoder level outputs (level 13). Of these, only the index sequences ending in a 1 are also constant on the Nth level outputs. When these $N(N+1)/2$ outputs are sampled simultaneously at the highest possible signal rate $2W_N$ and this sampling is continued for the $2\pi$-period of the lowest oscillation observed in $f_1$, or if this is constant, in $f_2$ and so forth, then one has recovered the complete information content of the original and stationary input portion.

It is now easy to see which information has to be recovered in addition to and distinct from the former as the representative of the phonemically non-stationary information content. In the presence of non-stationary components, the final outputs at the Nth level need not be constant or zero or even periodic. From the third to the Nth decoder level any branch of the tree at a certain level may become a constant and then, on the next level, become zero, or periodic or non-periodic at the N-th level.

If one samples again, this time all of the $2^N-1$ outputs, two situations can occur. The first situation is that all final outputs are zero, constant or periodic and nonperiodicities other than zero or constant are confined to intermediary outputs whose index does not end in 1. Monitoring the latter on the next decoder level allows one to determine the time samples when one periodicity changes into another. For example, as applied to speech, this allows for segmentation of phonemes as based exclusively on features inherent to the signal.

In a situation where final outputs are non-periodic, one may still segment almost as above but since the timing criteria of segmentation are lost at the Nth level, one must conclude that the band 1 to N was not partitioned optimally or that higher resolution, i.e., a decoder of an increased number of levels N is required.

Conversely it may turn out in the research phase that not all branches of an N-tree or not all the resolution of an N-level decoder is required to characterize and to distinguish different classes of phenomena of interest. In the former case, one saves the hardware of branches in the post-research phase; in the latter case, one can work with a decoder of less than N levels, again saving hardware. In general, however, for an arbitrary signal, not necessarily phonemic, the definition of stationarity entails that each decoder output, associated with the $2\pi$-period of its last preceding network (NW) stays materially unaltered for a time T far in excess of the frequency-associated periodicity $\tau=1/(2\pi\Omega NW)$. An output, therefore, in the general sense of information theory, is stationary (or non-stationary) if after proper frequency partitioning the duration T of its unaltered output state does (or does not) substantially exceed the periodicity or its preceding network. Monitoring these criteria allows separability of a signal into its stationary and non-stationary components plus the determination of the stationarity intervals of all components found with stationary behavior. The process of monitoring is implementable in hardware and, in principle, also in software.

After this description of the algebraic and switching-theoretic skeleton of non-stationarity decoders, a description of more involved and major modifications of the invention will be given.

UNIT SCALED, QUANTIZED AND/OR RELATIVELY COMPLETE EMBODIMENTS OF A NON-STATIONARITY DECODER

In many applications of the basic principles of the present invention, the outputs are not required nor desired in numerical format but rather in a binary or n-ary encoded form. Furthermore, there are numerous applications where, while N-fold frequency partitions are necessary, not all $2^N-1$ filters of N levels are required but only the $\binom{N}{v}$ filters of the first, second, . . . , $v$-th level with $v < N$ or even $v < < N$. These quantized and/or incomplete versions require modifications which will be discussed subsequently as aspects inherent in the invention.

Justification and motivation for this are seen from the fact that different level outputs of a complete decoder represent different physical qualities of the original input signal. For example, the input time function $f_o(t)$ of a signal amplitude outputs at the first level the time functions $f_i(t)$ of banded signal energy, commonly called the Fourier band spectrum. These spectra in turn output at the second decoder level 13 (see FIG. 1) the time functions $f_{ij}(t)$ of the spectrally resolved changes of energy in each band and they are periodic or non-zero constant functions if the input signal contained only stationary modulation. The outputs at the third decoder level 14 represent the time functions $f_{ijk}(t)$ of non-periodic changes in modulation of spectrally resolved energy bands and are non-constant functions for non-stationary components of the original input signal. In this manner, each one of the N decoder levels has its own and specific physical quality.

A decoder in the sense of the present invention is defined in contradistinction to a Fourier filter bank and/or envelope detector as a device containing the minimum-sized decoder of FIG. 4 whose constituents are:

a. a minimum of three different ranges of bandpass filters, denoted by their frequency indices A, B, C;

b. a minimum of two decoding levels and thus at least two classes of outputs representing two sets of different physical qualities, and c. at least one set of branching filters, (e.g., $A_1$, $B_1$) on a level following a preceding one (e.g., filter C of the previous level).

The algebraically complete decoder of FIG. 1 has precisely $2^N-1$ outputs. For applications where an incomplete decoder, a subset of the former, is adequate or relatively complete for an application, it can be obtained by deletion of complete levels or portions thereof, or by deletion of branches in the decoding tree or portions thereof, or by a combination of level and branch deletions. Such deletions are permissible provided the minimum size decoder criteria enumerated above are not violated. In all these cases, however, the outputs, upon sampling, provide non-quantized values, e.g., voltages or real valued numbers in analog or digital format.

In numerous applications it is either feasible or permissible, or both, to output a more comprehensive quantized (binary or m-ary) format. Systematic quantization requires normalization or scaling of outputs relative to inputs. FIG. 5 shows the prototype of a scaling network as used in the present invention, in particular in the network of FIG. 1.

The prototype of a scaling network shown in FIG. 5 for the output of filter type $k$ receives as an input the unscaled output $f_{i..jk}$ of said filter and the input $f_{i..j}$ into said filter; the latter may have been scaled and averaged before for another filter but this is immaterial for the filter $k$ under consideration. In the scaling network, the input $f_{i..jk}$ is averaged over a $2\pi$-interval corresponding to highest frequency in the bandpass of filter $k$. The means used for this averaging process will not be covered herein in detail for purposes of simplicity, while the interval restriction referred to is important for the correct functioning of the decoder. The integrator 20 shown in FIG. 5 depicted with an integral sign with an averaging bar represents just one well known method of obtaining a running average, namely by means of a standard analog computer circuit wherein the output of an integrating amplifier is fed back through an adjustable potentiometer into the integrating amplifier input and the potentiometer is adjusted so as to accomplish said $2\pi$ averaging window for the output relative to the time scaling of the input.

The output $\overline{f_{i..jk}}$ of specified averaging is fed into a divider circuit 21 and is divided by the aforementioned second input $f_{i..j}$. The output $[f_{i..jk}]$ of the divider circuit 21 and scaling network is bounded not to exceed 1.0 (since all inputs are non-negative) and is called the scaled function $f_{i..jk}$ where the last index always indicates that filter for which scaling has been performed.

A scaled decoder is obtained if each filter output of FIG. 1 is scaled by a network of the type shown in FIG. 5 and, in addition, the original input $f_o(t)$ is energy averaged. One thus obtains a scaled decoder as shown in FIG. 6 wherein the circles 22 provided at the filter outputs indicate the insertion points of the scaling networks. The original input $f_o$, as set forth hereinabove, does not represent energy as is the case with the filter outputs and is, therefore, to be rectified as symbolized by circuit 23 of FIG. 6 before being averaged in a manner similar to the first component 20 shown in FIG. 5 of a scaling network. The averaged $f_o$ value $\lceil \overline{f_o} \rceil$ serves as the $f_{i,j}$ or second input to the first level scaling networks.

The scaling process is performed inside the decoder and changes its $2^N-1$ outputs from their absolute values into relative values. These relative values can now be quantized in a consistent manner. Also, the use of scaling has an effect upon the specifications of the lowest-order filters (indexed 12-1, 13-1, 14-1, etc) in the decoder. This lowest frequency range must pass constant non-zero constituents or else the output balance cannot consistently match the input balance of 100%. Filters 12-1, 13-1, 14-1, etc. therefore, must be low pass filters and not merely bandpass filters if such constituents can occur during the decoding of $f_o(t)$. Furthermore, the division circuit (21 of FIG. 5) in the scaling networks 22 must be protected from divisional overflow (or rather 0/0) in case the denominator function $f_{i,j}$ is found and entered as zero. In order to forestall indeterminate quotients, provisions must be included in the scaling networks to set their scaled outputs, as an objective of this invention, to an overriding zero whenever the second input $f_{i,j}$ is found to be zero. The occurrence of a scaled zero output automatically forces all scaling network outputs following downstream in the decoder tree (i.e., higher levels) to zero. When this occurs consistently in an application with a class of signals, always at the same output, it is obviously possible to work with a scaled, but algebraically incomplete decoder. This clearly indicates that scaled but incomplete decoders legitimately exist.

A scaled decoder, whose complete version is shown in FIG. 6, can be quantized, as an objective of the present invention, in the following manner:

a. each output of a scaling network in the scaled decoder is tapped and is coupled into a quantizer associated with it, and b. the quantized outputs of the quantizer constitute the new set of decoder outputs.

It should be noted that the scaled functions $[f_{i,jk}]$ which formerly served as outputs, remain intact in the decoder as decoder functions to be monitored by quantizers. Unlike the insertion of scaling networks, the addition of quantizers does not interrupt the circuit tree of information flow nor alter the format or nature of a previously defined quantity. Quantification can be achieved in various ways of which this present invention considers two of specific importance, namely binary and 7-ary quantification.

A binary quantizer to be tapped into the scaled decoder at various places as specified above, is depicted in FIG. 7. The binary quantizer 25 has two inputs and a binary output. The first input is a scaled function $[f_{i,jk}]$ of a decoder branch and the second input is a threshold function $w(K)$ whose value (usually less than 1.0) is dependent upon the number K of filters $k=1,\ldots, K$ which are fed from the same input function $f_{i,j}$. For example, for $f_{i,j} = f_4$ where there are K=3 filters fed, the scaled outputs $[f_{41}]$, $[f_{42}]$, $[f_{43}]$ could each be thresholded with $w(3) = \frac{1}{3} = 1/K$.

The value of the binary quantized output $Q(f_{i,jk})$ depends upon the positive or negative sign of the difference $[f_{i,jk}]-w(K)$ of the two inputs as obtained from a comparator 25a as shown in FIG. 7. The method of implementation of the comparison operation may be carried out by present day hardware with a detailed description of a comparator omitted herein for purposes of simplicity. However, it is an objective of a scaled decoder with binary output quantification, that the comparison threshold $w(K)$ be a function of the number of filters supplied by the same input as specified hereinabove and that one quantizer tap each scaling network output that has been implemented.

The binary quantizers can be replaced by any type quantizer similar in nature to that described hereinabove. For many applications the 7-ary quantizer of FIG. 8 provides comprehensive encoding; the quantizer 26 shown therein has five inputs and four binary outputs of whose $2^4$ combinations, 7 are realizable and meaningful, as will be detailed hereinbelow.

The first input 27 is a scaled decoder function $[f_{i,jk}]$. The second input 28 receives the quantity $w_1(K)$ which is a threshold value dependent upon the number K of filters $k=1,\ldots, K$ fed from the same input $f_{i,j}$. Comparator 29 associated with the input quantities applied to terminal 27 and 28 produces the binary quantized output Q1 which encodes relevance or relative insignificance of $[f]$ by a 1 or 0 respectively; the value of the quantity applied to input 28, $w_1(K)$, can be set, for example, equal to $1/10K$ or $1/K^2$ or $1/K^{3/2}$ where K is defined as specified above.

In a similar manner the output Q2 is a binary quantification of the predominant relevance of $[f]$ versus just simple relevance. The comparison threshold function $w_2(K)$ applied to input 30 generally exceeds $w_1$; $w_2(K)$ can be set, for example, as being equal to $1/K$ or $\frac{1}{2}K$ or $1/K^{1/2}$. The inputs appearing at terminals 27 and 30 are coupled into comparator 31 to yield the output Q2.

The fourth input quantity $\tau(\Omega_n)$ is a design parameter for a delay function which in FIG. 8 is symbolized by delay circuit 33. The output of the delay circuit is coupled to the input of a subtraction circuit 34 and a comparator network 35 in order to delay $[f]$ by a time equivalent to one period of the higher cut-off frequency $\Omega_n$ of the filter $k$ under consideration. Indices $n$, with $n=1,\ldots, N$, and $k$ are synonymous only because filters are sequentially indexed in FIGS. 1 and 6 in the sequence of increasing cut-off frequencies.

Comparator 35 of FIG. 8 is fed by the output of delay circuit 33 and the current value $[f]$ to provide a binary quantification output Q3 which is either 1 or 0 dependent upon whether $[f]$ has been increasing or decreasing respectively; and this output represents the sign of a first time derivative.

The remaining building blocks in the 7-ary quantizer determine the relevance of this derivative. First, by subtracting the output of delay circuit 33 from the quantity $[f]$ signified by subtraction circuit 34, one obtains the signal $\Delta f$. This $\Delta f$ signal is fed into a divider circuit 36 whose magnitude output $|\Delta f/f|$ is fed into comparator 37 which also receives the fifth input $w_3$ to determine the relevance or insignificance of the logarithmic derivative by setting the quantified output Q4 to 1 or 0 respectively. It should be noted that the division circuit requires monitoring of the denominator with an overriding zeroing response onto Q4 if the input quantity $[f]$ is zero. Examples of values for $w_3$ are 0.10 or 0.18.

While the method of implementation of comparators, delay circuits, subtraction and division circuits in this quantizer are not shown in detail, it should be understood that state of the art circuits may be employed for these applications. However, the specifications for the input functions $[f]$, $w_1$, $w_2$, $w_3$, $\tau$ are of no importance to and characteristic of the correct functioning of a nonstationarity decoder according to the present invention. The extremely general applicability and fundamental importance of the decoder described in this invention is further more exemplified by a study of its outputs.

A more detailed understanding of the meaning and usefulness of the four Q-outputs of a 7-ary quantizer can be obtained from the following table. In this table $f^{(v)}$ 0 stands for a function to be quantized at level $v$. The letters A and B signify boundary or threshold values; the letter $\epsilon$ stands for a relatively small quantity. A dot over $f$ is used as the traditional symbol for the derivative of $f$. Logical one or logical zero is attributed to the Q-values as follows:

Q1 ≡ significance : IF($f^{(v)} \geq \epsilon$) → Q1=1; IF($f^{(v)}<\epsilon$) → Q1=0
Q2 ≡ prominence : IF($f^{(v)} \geq A>\epsilon$) → Q2=1; IF($f^{(v)}<A$) → Q2=0
Q3 ≡ sign of slope : IF($\dot{f}^{(v)} \geq 0$) → Q3=1; IF($\dot{f}^{(v)}<0$) → Q3=0
Q4 ≡ slope significance : IF($|\dot{f}^{(v)}| \geq B$) → Q4=1; IF($|\dot{f}^{(v)}|<B$) → Q4=0

The meaning and importance of the aforementioned 7 (formalistically 10) out of $2^4$ combinations of Q-values is seen from this next table.

| No. | Q1 | Q2 | Q3 | Q4 | $f^{(v)}$ | $\dot{f}^{(v)}$ |
|---|---|---|---|---|---|---|
| 1 | 0 | 0 | 0 or 1 | 0 | zero or negligible | zero or negligible |
| 2 | 1 | 0 | 0 or 1 | 0 | non-negligible | approximately constant |
| 3 | 1 | 0 | 0 | 1 | non-negligible | non-negligible and decreasing |
| 4 | 1 | 0 | 1 | 1 | non-negligible | non-negligible and increasing |
| 5 | 1 | 1 | 0 | 1 | prominent | non-negligible and decreasing |
| 6 | 1 | 1 | 1 | 1 | prominent | non-negligible and increasing |
| 7 | 1 | 1 | 0 or 1 | 0 | prominent | approximately constant |

Figure 9:
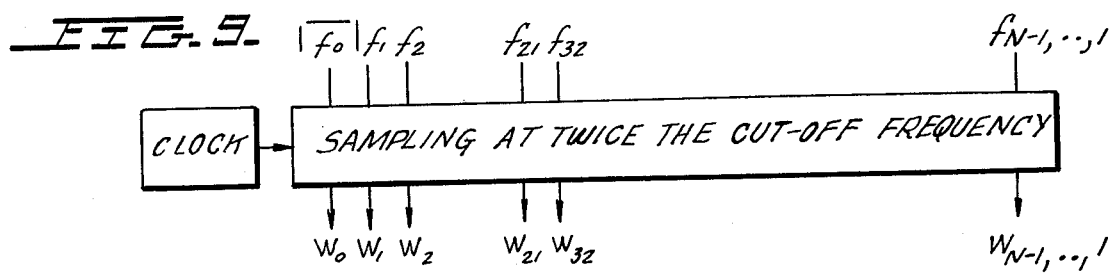
FIG. 9 shows a simplified block diagram indicating the manner in which the time functions at the final output of the decoder are converted into sampled code words.

FIG. 9 shows the sampling of the $2^N$ outputs $|\overline{f_0}|, f_1, f_2, \ldots, f_{21}, f_{32}, \ldots, f_{N-1, \ldots 2, 1}$ which, when fed from a scaled and quantized decoder such as shown in FIG. 6, are sampled at twice the upper cut-off frequency $\Omega_N$ detected in the original input $f_o(t)$, and outputted as code words $W_o, W_1, W_2, \ldots, W_{21}, W_{32}, \ldots, W_{N-1, \ldots 2, 1}$ respectively. While the decoder functions $f(t)$ are continuous Lebesgue functions of time, the code words $W^{(s)}$ are only defined at variable indices $s$, referring to time sampled $f$'s with a sampling rate of $2\Omega_N$.

Assuming adequate resolution in the choice of N passbands, it can be seen that the sets of code words W represent faithfully all stationary and non-stationary signals because they contain at least the single sideband for any amplitude modulation, phase modulation and frequency modulation. The optimization of the averaging intervals, tuned to the upper cut-off frequencies of individual filters, provides for instant response and does not impose a false stationarity assumption onto non-stationary signal components. Despite the rectification of the filter outputs, the phase information is preserved by the same means as the sensing of amplitude changes, i.e., by the sequence of code words from the same output. This is seen if one differences sequential binary output values $b$ from the same output word $W_i$, viz:

$$W_i(b_{s+1}) - W_i(b_s) = W_i^*(b_{s+1}-b_s)$$

This subtraction rule is the same as in potential theory; it is explicitly embodied in the slant-feature obtained under 7-ary quantification.

Finally, it is also easy to see why the decoder of this invention is complete in the sense of Shannon's communication theory. All one need recall is that Shannon's formalism applies to both parallel and serial information, also to both frequency and time partitions even though the textual explanations favor serial input and, thus, time partitioned sampling. The proof is as follows:

Given is a discrete or continuous input $f_o$ which at any time can be adequately described by N bits of information, which means adequate "resolution". Each input is a representation of one set out of at most $2^N$ different input words where under equiprobability $p$(input)$=2^{-N}$ for any set of N bits.

The entropy of the encoded signal is (by summation or integration)

$$H = -K \sum_{i=1}^{2^N} p_i \log_2 p_i = -K \times 2^N \times 2^{-N} \times (-N) = KN$$

$\log_2 p_i = -K \times 2^N \times 2^{-N} \times (-N) = KN$ or if we maximize the channel entropy to H=1 we get K=1/N through a choice of unit. For decoding, on the other hand, we have $$\tilde{H} = \lim_{N \to \infty} \frac{\log_2 n(q)}{N}$$

and the specification $H \doteq \tilde{H}$ of complete decoding yields $n(q)=2^N$ as the number of bits required to decode the most probable (parallel) sequences with a total probability $q<1$ for finite N. But $n(q)=2^N$ is precisely the number of independent bits at the (parallel) output of the decoder; it is therefore complete. By definition of non-stationarity and signal content its output cannot change faster than at the rate of $\Omega_N$ which constitutes a minimum sampling rate for code words W.

The proof is based on theorems 2 and 4 and appendices 2 and 3 of Shannon's paper.

According to information theory and also according to the present invention, a complete decoding can be achieved with an incomplete decoder if the class of input signals considered does not fully utilize all of its $2^N$ theoretically possible input sequences. For example, a phonemically stationary signal whose modulations are constant in time, can be decoded by only the first three levels of the decoder. Therefore, it requires only $$\sum_{v=1}^{3} \binom{N}{v} = \frac{N}{6}(5+N^2)$$

outputs. These values differ noticeably from $2^N$ for the same fixed N only beyond N=10 which explains why Fourier analysis had only moderate success above complete failure with stationary and non-stationary signals whose recognized resolution, i.e. N, was rather limited to a few narrow and relevant bands.

Figure 10:
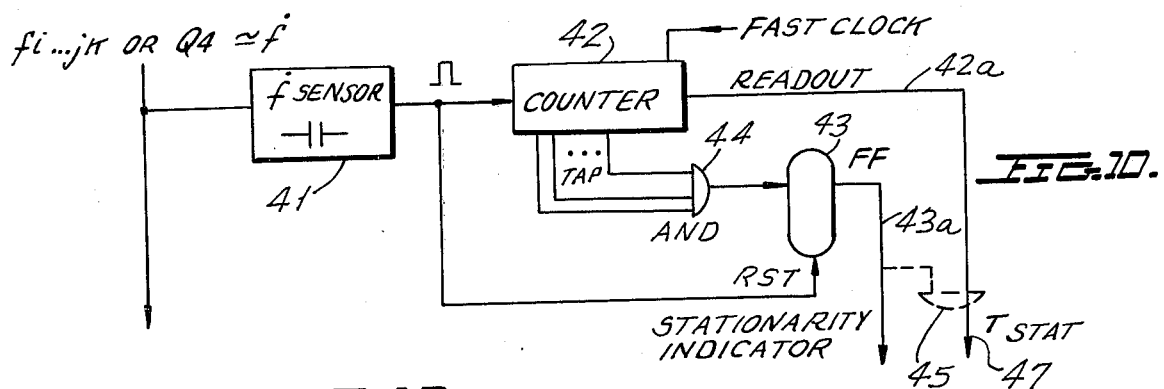
FIG. 10 shows a simplified block diagram of a stationarity indicator which may be employed in the decoder final outputs of the present invention.
Figure 10A:
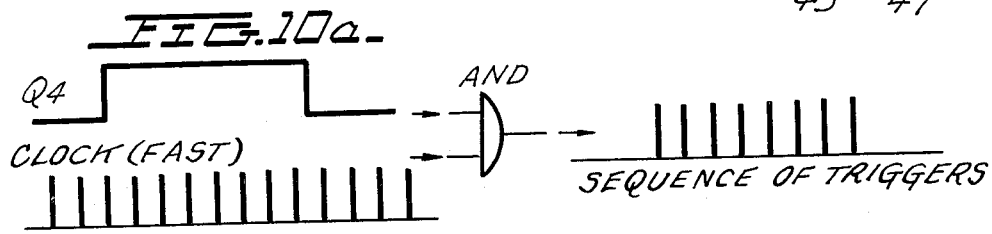
FIG. 10a shows an alternative output of the stationarity indicator gate of FIG. 10. The output is obtained as a sequence of trigger pulses from the fast clock if the differentiator ($f$ sensor in FIG. 10) is replaced by the scaled Q4 output (slant significance) which is shown in greater detail in FIG. 8.

For the general case of a mixed stationary-non-stationary signal, an explanation will now be given of a typical hardware implementation for separating and distinguishing relevant stationary from relevant non-stationary outputs of the decoder. Given a function $f_i \ldots _{jk}$ of time, the objective is to determine from its time derivative, if the latter remains zero or sufficiently small for a time interval long enough to qualify the function $f_i \ldots _{jk}$ as stationary. As is shown in FIG. 10, it is necessary to monitor changes of $f_i \ldots _{jk}$ in the course of time or, as in a case of FIG. 10a, to employ from FIG. 8 the binary output equivalent to a significant non-zero derivative and associated with such $f_i \ldots _{jk}$, namely Q4, to derive a trigger pulse directly from the AND-gating with an oscillator whose rate is equal to the $2\pi$ periodicity of the highest harmonic possibly present in $f_i \ldots _{jk}$.

The occurrence of such a trigger pulse signals a negating of the stationarity status, and, consequently resets (see FIG. 10) the stationarity indicator flip-flop 43 and also resets the associated stationarity time counter 42 whereupon a new count is initiated. The count continues until reset by another trigger pulse. The counter is incremented by a fast clock input whose repetition rate is equal to the decoder output sampling frequency, i.e., at twice the rate of the highest frequency possibly to occur in the original decoder input.

The stationarity indicator flip-flop 43 associated with $f_i \ldots _{jk}$ and/or its derivative $f_i \ldots _{jk}$ will be set only when a prearrangeable count is attained by counter 42, which count is directly proportional to the number P of clock pulses within the $2\pi$ interval of the highest possible frequency present in $f_i \ldots _{jk}$. The count is also directly proportional to the multiple M of said $2\pi$ interval specified as the minimum multiple to qualify $f_i \ldots _{jk}$ as stationary. Thus, typical M values are, say, 10 and as low as 2 but not less. If there are N different types of analyzing networks, then there are at most N different arrangements of taps justifiable with said counters in the decoder.

For several applications it is convenient to have a readout of the accrued time interval of stationarity, $T_{STAT}$ available. Its accessibility can be AND-gated with the TRUE state of the stationarity flip-flop 43 as indicated symbolically by AND-gate 45 shown in dotted fashion and receiving as inputs the readout output 42a of counter 42 and the output 43a of the stationarity flip-flop 43.

Furthermore, it is to be noted that flip-flop 43 can set and thus confirm the stationarity status of $f_i \ldots _{jk}$ no sooner than after M·P clock pulses have elapsed. The delayed confirmation of stationarity is due to its definition and, therefore, the time interval during which flip-flop 43 is in the set state, signifying stationarity, falls short by an interval of length M·P which is easily verified by reading the accrued output $T_{STAT}$ of counter 42.

It can be seen from the foregoing description that the present invention provides a novel and useful system for analysis of both stationary and non-stationary signals to provide accurate identification of all components within the signal to greatly facilitate in-depth analysis thereof as well as unique identification of any signal as compared with other signals of the same or different classes.

Although the present invention has been described in connection with a number of preferred embodiments thereof, many variations and modifications will now become apparent to those skilled in the art. It is preferred, therefore, that the present invention be limited not by the specific disclosure herein, but only by the appended claims.

What is claimed is:

1. A decoder network for information-theoretically completely identifying all constituents of an input signal, said decoder network comprising:
    an input terminal receiving the input signal;
    $2^N$ output terminals where N is greater than 1;
    $2^N-1$ analyzing networks which are classified into at least N distinct types, each of said analyzing networks having an input and an output; said analyzing networks when looked at as 2-poles being connected after the input terminal, which input terminal is labeled level zero, to form the linking branches of a binomial tree graph network of N+1 sequential levels with $\binom{N}{v}$, where $v=1, \ldots, N$, analyzing networks per level $v$; the analyzing networks of each level $v$ being selectively connected as ordered sets according to type indices K, the N analyzing networks on the first level where $v=1$ having sequential indices K, $K=1, \ldots, N$, each analyzing network on the first level having its input fed in parallel from the input terminal, and on all further levels with $v$ greater than 1 the output of each analyzing network of an immediately preceeding level $(v-1)$ and of type K greater than 1 feeds in parallel the inputs of an ordered set of analyzing networks ranging in type from index 1 to index $(K-1)$; and wherein the output of each of said $2^N-1$ analyzing networks and the input terminal is individually connected to a separate one of said output terminals for monitoring of the input-signal-decoding achieved within said decoder network.

2. The apparatus of claim 1, wherein said analyzing networks are filtering networks and wherein the networks of distinct types having a different designating number have a different frequency passband.

3. The apparatus of claim 2, wherein the passbands of said distinct types of networks are nonoverlapping.

4. The apparatus of claim 3, further comprising means coupled to the output of each filtering network for individually rectifying and averaging only the output of the filtering network to which each means is coupled over a time interval no greater than one period of the upper cut-off frequency of the bandpass filter to which the rectifying and averaging means is coupled.

5. The apparatus of claim 4, further comprising means for, separately and in parallel to the signal flow in the decoder, rectifying and averaging over no more than the signal Nyquist frequency the inputs to filters of each level $v$ where $v=1, \ldots, N$, as derived from the original decoder input signal for $v=1$ or from the next lower level coupled thereto for $v>1$;

means for dividing the rectified averaged outputs of each filter in each decoder level $v$ by the rectified averaged input to the same filter to form a quotient representing the normalized output for each analyzing network in the signal flow of the decoder binomial tree.

6. The apparatus of claim 5, further comprising first means, each coupled from the normalized output of the quotient forming division network of each analyzing network for forcing to zero the normalized output of the dividing means to which each of said first means is coupled whenever the averaged (denominator) input to said filter is zero.

7. The apparatus of claim 6, comprising means to access in parallel the normalized outputs and the rectified averaged original input signal as the totality of $2^N$ final outputs of the decoder.

8. The apparatus of claim 6, comprising quantizing means coupled separately and in parallel with the decoder signal flow to said normalized outputs to generate and access one each of $2^N$ quantized final outputs employed as observable values of the decoder.

9. The apparatus of claim 7, further comprising second means for quantizing the normalized outputs of filters at each level $v$, where $v=1,2,..,N$ said quantizing means comprising means for comparing the non-quantized normalized output of a filter at level $v$ against a weighting function $w(m)$ whose argument $m$ is equal to the number of filters of level $v$ which have their inputs coupled in common to a distinct filter from level $(v-1)$, wherein the output of said comparator is 1 when the said normalized output of the filter at level $v$ is at least equal to the value of said weighting function and wherein the output is 0 when the normalized output of the filter at level $v$ is less than the value of said weighting function.

10. The apparatus of claim 9, further comprising second quantizing means for comparing the normalized output of a filter at level $v$ against the value of a weighting function $w_2(m)$ having the same argument as $w_1(m)$ and a different value than the value of weighting function $w_1(m)$, the output of said second comparator being 1 when the value of the normalized output of the filter at level $v$ is at least equal to the value of function $w_2(m)$ and 0 when the normalized output of the filter at level $v$ is less than the value of $w_2(m)$.

11. The apparatus of claim 10, further comprising third quantizing means having means for delaying the normalized output of the scaled function of a filter of level $v$ by a specified interval and means for comparing the delayed normalized output against the undelayed normalized output of the same filter, said third quantized output being 1 whenever said undelayed output is equal to or greater than said delayed output and 0 whenever said undelayed output is less than said delayed output.

12. The apparatus of claim 11, further comprising fourth quantizing means including means for subtracting said delayed normalized output from said undelayed normalized output, means for dividing the output of said subtracting means by said undelayed normalized output and means for comparing the output of said dividing means against the value of a weighting function $w_3$, wherein the output of said comparator is 1 when the output of said dividing means is at least equal to the value of $w_3$ and is 0 when the output of said dividing means is less than the value of $w_3$.

13. The apparatus of claim 12, comprising quantizing means coupled separately and in parallel with the decoder signal flow to said normalized outputs to generate and access said four per each of $2^N-1$ quantized final outputs employed as observable values of the decoder.

14. A decoder network for heuristically completely identifying all relevant constituents of an input signal to be analyzed, said decoder network comprising:
an input terminal receiving the input signal;
at most $2^N-1$ analyzing networks of at least one and at most N, with $N>1$, distinct types, each of said analyzing networks having an input and an output, said analyzing networks when looked at as 2-poles being connected after the input terminal, which input terminal is labeled level zero, to form the linking branches of a first network configured as a proper subgraph of a binomial tree graph, said first network having at most N+1 sequential levels with at most $(_v^N)$, where $v=1,\ldots,N$, analyzing networks per level $v$; the analyzing networks of each level $v$ being connected as ordered sets according to type indices K, with at most $K=1,\ldots,N$ analyzing networks on the first level, each analyzing network on the first level having its input coupled to the input terminal, and on subsequent levels with $v$ greater than 1 the output of each analyzing network of level $(v-1)$ and of type K greater than 1 feeds in parallel the input of an ordered set of analyzing networks ranging in type at most from index 1 to index $(K-1)$; and at most $2^N$ output terminals, each output terminal individually connected to one of the outputs of at least 1 and at most $2^N-1$ analyzing networks and to the input signal for monitoring of the input-signal-decoding achieved within said decoder network.

15. The apparatus of claim 14 comprising at least six of said analyzing networks being arranged after the input in at least two sequential levels with at least three distinct types of said networks on the first level and at least two distinct types of said networks on the second level.

16. The apparatus of claim 15 wherein said analyzing networks are filtering networks and wherein the networks of distinct types and levels have different but not necessarily disjoint frequency passbands.

17. The apparatus of claim 16 wherein the passbands of said types of networks are non-overlapping.

18. The apparatus of claim 17, further comprising means coupled to the output of each filtering network for individually rectifying and averaging only the output of the filtering network to which each means is coupled over a time interval no greater than one period of the upper cut-off frequency of the bandpass filter to which the rectifying and averaging means is coupled.

19. The apparatus of claim 18, further comprising means for, separately and in parallel to the signal flow in the decoder, rectifying and averaging over no more than the signal Nyquist frequency the inputs to filters of each level $v$ where at most $v=1,\ldots,N$, as derived from the original decoder input signal for $v=1$ or from the next lower level coupled thereto for $v>1$;
means for dividing the rectified averaged outputs of each filter in each decoder level $v$ by the rectified averaged input to the same filter to form a quotient representing the normalized output for each analyzing network in the signal flow of the decoder binomial tree.

20. The apparatus of claim 19, further comprising first means, each coupled from the normalized output of the quotient forming division network of each analyzing network for forcing to zero the normalized output of the dividing means to which each of said first means is coupled whenever the averaged input to said filter is zero.

21. The apparatus of claim 20, comprising quantizing means coupled separately and in parallel with the decoder signal flow to said normalized outputs to generate and access one each of at most $2^N$ quantized final outputs employed as observable values of the decoder.

22. The apparatus of claim 20, comprising means to access in parallel the normalized outputs and the rectified averaged original input signal as the totality of at most $2^N$ final outputs of the decoder.

23. The apparatus of claim 21, further comprising second means for quantizing the normalized outputs of filters at each level $v$, where $v=1,2,\ldots,N$ said quantizing means comprising means for comparing the non-quantized normalized output of a filter at level $v$ against a weighting function $w(m)$ whose argument $m$ is equal to the number of filters of level $v$ which have their inputs coupled in common to a distinct filter from level $(v-1)$, wherein the output of said comparator is 1 when the said normalized output of the filter at level $v$ is at least equal to the value of said weighting function and wherein the output is 0 when the normalized output of the filter at level $v$ is less than the value of said weighting function.

24. The apparatus of claim 23, further comprising second quantizing means for comparing the normalized output of a filter of level $v$ against the value of a weighting function $w_2(m)$ having the same argument as $w_1(m)$ and a different value than the value of weighting function $w_1(m)$, the output of said second comparator being 1 when the value of the normalized output of the filter at level $v$ is at least equal to the value of function $w_2(m)$ and 0 when the normalized output of the filter at level $v$ is less than the value of $w_2(m)$.

25. The apparatus of claim 24, further comprising third quantizing means having means for delaying the normalized output of the scaled function of a filter of level $v$ by a specified interval and means for comparing the delayed normalized output against the undelayed normalized output of the same filter, said third quantized output being 1 whenever said undelayed output is equal to or greater than said delayed output and 0 whenever said undelayed output is less than said delayed output.

26. The apparatus of claim 25, further comprising fourth quantitizing means including means for subtracting said delayed output from said undelayed output, means for dividing the output of said subtracting means by said undelayed output and means for comparing the output of said dividing means against the value of a weighting function $w_3$, wherein the output of said comparator is 1 when the output of said dividing means is at least equal to the value of $w_3$ and is 0 when the output of said dividing means is less than the value of $w_3$.

27. The apparatus of claim 26, comprising quantizing means coupled separately and in parallel with the decoder signal flow to said normalized outputs to generate and access said four per each of at most $2^N-1$ quantized final outputs employed as observable values of the decoder.

28. Sensing means for recognizing the stationarity or non-stationarity of a signal being analyzed comprising:

a clock pulse source operating at a frequency which is at least twice the rate of the highest frequency component of the signal being analyzed;

a counter incremented by said clock source;

said counter having a counting capacity predeterminately selected to be a multiple of between 10 and 1000 times the number P of clock pulses in the $2\pi$ interval of the highest frequency component in the signal being analyzed at the point under consideration;

means for receiving the signal being analyzed;

means coupled to the output of said receiving means for differentiating the output of said receiving means in a time scale equal to one period of the signal being analyzed at the point under consideration;

a bistable flip-flop having a set and a reset input and an output, the output of said differentiation means being coupled to said reset input and to said counter for resetting said counter and said flip-flop whenever the output of said differentiation means is non-zero;

gating means coupled to said counter for setting said flip-flop when the count accumulated by said counter is equal to the capacity of said counter;

said flip-flop output being high whenever said counter accumulates a count equal to said capacity to indicate stationarity.

29. The device of claim 28, wherein said counter comprises readout means for generating an output whenever the counter accumulates a count equal to the time interval specified for fulfilling the condition of stationarity.

30. The device of claim 29, further comprising an AND gate coupled to said readout means and the output of said flip-flop for generating an output only when said stationarity time interval and said counter capacity is reached.

31. In combination sensing means for recognizing the stationarity or non-stationarity of a signal being analyzed and a decoder network for information-theoretically completely identifying all constituents of an input signal, said sensing means comprising:

a clock pulse source operating at a frequency which is at least twice the rate of the highest frequency component of the signal being analyzed;

a counter incremented by said clock source;

said counter having a counting capacity predeterminately selected to be a multiple of between 10 and 1000 times the number P of clock pulses in the $2\pi$ interval of the highest frequency component in the signal being analyzed at the point under consideration;

means for receiving the signal being analyzed;

means coupled to the output of said receiving means for differentiating the output of said receiving means in a time scale equal to one period of the signal being analyzed at the point under consideration;

a bistable flip-flop having a set and a reset input and an output, the output of said differentiation means being coupled to said reset input and to said counter for resetting said counter and said flip-flop whenever the output of said differentiation means is non-zero;

gating means coupled to said counter for setting said flip-flop when the count accumulated by said counter is equal to the capacity of said counter;

said flip-flop output being high whenever said counter accumulates a count equal to said capacity to indicate stationarity;

said decoder network including an input terminal receiving said input signal; and $2^N-1$ analyzing networks which are classified into at least N distinct types where N is greater than 1, each of said analyzing networks having an input and an output, said analyzing network when looked at as 2-poles being connected after the input terminal, which input terminal is labeled level zero, to form the linking branches of a binomial tree graph network of N+1 sequential levels with $\binom{N}{v}$, where $v=1,\ldots,N$, analyzing networks per level; the analyzing networks of each level $v$ being selectively connected as ordered sets according to type indices K, the N analyzing networks on the first level where $v=1$ having sequential indices K, $K=1,\ldots,N$, each analyzing network on the first level having its input fed in parallel from the input terminal, and on all further levels with $v$ greater than 1 the output of each analyzing network of an immediately preceding level ($v-1$) and of type K greater than 1 feeds in parallel to inputs of an ordered set of analyzing networks ranging in type from index 1 to index (K−1); and wherein the outputs of all $2^N-1$ analyzing networks and the input terminal are available for monitoring of the input-signal-decoding achieved therein;

said signal receiving means being coupled to one of the totality of said input terminal and said $2^N-1$ analyzing network outputs of said decoder network.

32. The device of claim 31, wherein said counter comprises readout means for generating an output whenever the counter accumulates a count equal to the time interval specified for fulfilling the condition of stationarity; and an AND gate coupled to said readout means and the output of said flip-flop for generating an output only when said stationarity time interval and said counter capacity is reached.

* * * * *